US009620657B2

United States Patent
Lee et al.

(10) Patent No.: US 9,620,657 B2
(45) Date of Patent: Apr. 11, 2017

(54) IMAGE SENSOR AND ELECTRONIC DEVICE INCLUDING THE SAME

(71) Applicant: Samsung Electronics Co., Ltd., Suwon-Si, Gyeonggi-Do (KR)

(72) Inventors: Gae Hwang Lee, Seongnam-si (KR); Kyu Sik Kim, Yongin-si (KR); Yong Wan Jin, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 14/174,211

(22) Filed: Feb. 6, 2014

(65) Prior Publication Data

US 2015/0041940 A1 Feb. 12, 2015

(30) Foreign Application Priority Data

Aug. 6, 2013 (KR) .................... 10-2013-0093281

(51) Int. Cl.
*H01L 27/146* (2006.01)
*H01L 31/0232* (2014.01)

(52) U.S. Cl.
CPC .. *H01L 31/02327* (2013.01); *H01L 27/14621* (2013.01); *H01L 27/14625* (2013.01); *H01L 27/14629* (2013.01); *H01L 27/14645* (2013.01)

(58) Field of Classification Search
CPC ........... H01L 31/0232; H01L 31/02325; H01L 31/02327; H01L 31/14621; H01L 31/14625; H01L 27/14621; H01L 27/14625; H01L 27/14645
See application file for complete search history.

(56) References Cited

U.S. PATENT DOCUMENTS

| 6,861,280 B2 | 3/2005 | Yamamoto |
| 8,063,352 B2 | 11/2011 | Blayvas |
| 2004/0080008 A1 | 4/2004 | Yamamoto |
| 2006/0125944 A1* | 6/2006 | Inuiya .................... 348/311 |
| 2008/0286896 A1 | 11/2008 | Jung |
| 2009/0283758 A1* | 11/2009 | Nomura et al. ............. 257/40 |
| 2010/0327151 A1 | 12/2010 | Blayvas |
| 2011/0192962 A1* | 8/2011 | Nishiwaki et al. .......... 250/226 |

FOREIGN PATENT DOCUMENTS

| JP | 2009-130017 A | 6/2009 |
| KR | 10-0843968 B1 | 7/2008 |
| KR | 2010-0052838 A | 5/2010 |

* cited by examiner

*Primary Examiner* — Yu Chen
(74) *Attorney, Agent, or Firm* — Harness, Dickey & Pierce, P.L.C.

(57) ABSTRACT

An image sensor includes a semiconductor substrate integrated with at least one first photo-sensing device sensing light in a first wavelength region and at least one second photo-sensing device sensing light in a second wavelength region shorter than the first wavelength region, a photoelectric device including a pair of electrodes facing each other and a light absorption layer between the electrodes, the photoelectric device selectively absorbing light in a third wavelength region between the first wavelength region and the second wavelength region, and a nanostructural body between the semiconductor substrate and the photoelectric device, the nanostructural body including at least two parts having different optical paths.

19 Claims, 8 Drawing Sheets

IMAGE SENSOR AND ELECTRONIC DEVICE INCLUDING THE SAME

CROSS REFERENCE TO RELATED APPLICATION

This application claims priority to and the benefit of Korean Patent Application No. 10-2013-0093281 filed in the Korean Intellectual Property Office on Aug. 6, 2013, the entire contents of which are incorporated herein by reference.

BACKGROUND

1. Field

Example embodiments are related to an image sensor and an electronic device including the same.

2. Description of the Related Art

A photoelectric device converts light into an electrical signal using photoelectric effects, and may include a photodiode and/or a phototransistor, and may be applied to an image sensor and/or a solar cell.

An image sensor including a photodiode requires high resolution and thus a small pixel. At present, a silicon photodiode is widely used, but it may have a deteriorated sensitivity because it has a small absorption area due to small pixels.

On the other hand, a color filter may be used for selectively absorbing light in a predetermined or given wavelength region in each pixel when light enters an image sensor. A red filter, a blue filter, and a green filter are respectively disposed on a red pixel, a blue pixel, and a green pixel and selectively absorb red, blue, and green light, and the selectively absorbed light may be transferred to a photodiode of each pixel.

However, because the color filter absorbs light by itself, a substantial amount of light is lost while being transferred to the photodiode, and the area absorbing light in each pixel is decreased to about ⅓ when including, for example, a red pixel, a blue pixel, and a green pixel, so that each pixel uses only about ⅓ of available light.

SUMMARY

Example embodiments provide an image sensor with improved sensitivity and optical efficiency by enhancing wavelength selectivity for each pixel while increasing the area absorbing light.

Example embodiments also provide an electronic device including the image sensor.

According to example embodiments, an image sensor may include a semiconductor substrate integrated with at least one first photo-sensing device sensing light in a first wavelength region and at least one second photo-sensing device sensing light in a second wavelength region shorter than the first wavelength region, a photoelectric device including a pair of electrodes facing each other and a light absorption layer between the electrodes, the photoelectric device selectively absorbing light in a third wavelength region between the first wavelength region and the second wavelength region, and a nanostructural body between the semiconductor substrate and the photoelectric device, the nanostructural body including at least two parts having different optical paths.

The first wavelength region may be a red wavelength region, the second wavelength region may be a blue wavelength region, and the third wavelength region may be a green wavelength region. The nanostructural body may be between the at least one first photo-sensing device and the at least one second photo-sensing device. The nanostructural body may have an asymmetric structure. The nanostructural body may include a first part having a first length along a vertical direction and a second part having a second length shorter than the first length. The first part may be adjacent to the at least one first photo-sensing device, and the second part may be adjacent to the at least one second photo-sensing device.

The first part and the second part may be in contact with each other or separate from each other. The nanostructural body may have a width of less than or equal to about 1 μm, and the first length of the nanostructural body may be less than or equal to about 2 μm. The nanostructural body may include one of an oxide, a nitride, a sulfide, and a combination thereof. The nanostructural body may include a material having a refractive index of about 1.6 to about 2.6.

The image sensor may further include an insulation layer surrounding the nanostructural body between the semiconductor substrate and the photoelectric device, wherein the nanostructural body may include a material having a higher refractive index than the insulation layer. The insulation layer may include a silicon oxide, and the nanostructural body may include one of a silicon nitride, a titanium oxide, zinc sulfide, and a combination thereof.

The pair of electrodes facing each other may be light-transmitting electrodes, and the light absorption layer may include a p-type semiconductor material selectively absorbing light in the third wavelength region and an n-type semiconductor material selectively absorbing light in the third wavelength region. The third wavelength region may be a green wavelength region.

The at least one first photo-sensing device and the at least one second photo-sensing device may be arranged along one direction, and the nanostructural body may be between the at least one first photo-sensing device and the at least one second photo-sensing device and has a shape that is elongated along the one direction. The at least one first photo-sensing device and the at least one second photo-sensing device may be alternately arranged along one direction, and the nanostructural body may be arranged in different directions according to the at least one first photo-sensing device and the at least one second photo-sensing device.

The image sensor may further include a focusing lens configured to collect light into the nanostructural body by controlling the incidence direction of the light. The focusing lens may be on the photoelectric device. The focusing lens may cover at least one of the at least one first photo-sensing device and the at least one second photo-sensing device.

According to example embodiments, an electronic device may include the image sensor of example embodiments.

DETAILED DESCRIPTION

Example embodiments will hereinafter be described in detail, and may be easily performed by those who have common knowledge in the related art. However, this disclosure may be embodied in many different forms, and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Figure 1:
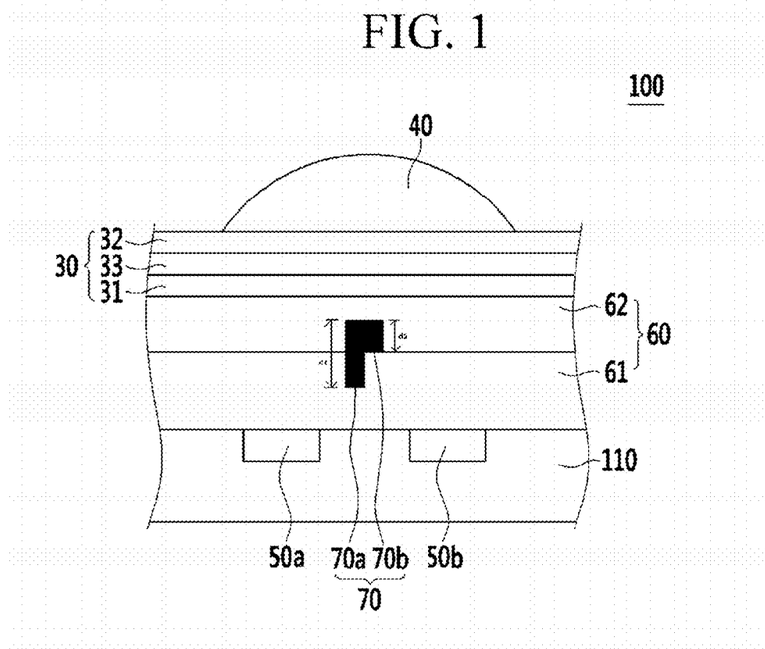
FIG. 1 is a cross-sectional view of a CMOS image sensor according to example embodiments.

Referring to FIG. 1, a CMOS image sensor according to example embodiments is described.

FIG. 1 is a cross-sectional view of a CMOS image sensor according to example embodiments.

Referring to FIG. 1, a CMOS image sensor 100 according to example embodiments includes a semiconductor substrate 110, a nanostructural body 70, an insulation layer 60, a photoelectric device 30, and a focusing lens 40.

The semiconductor substrate 110 may be a silicon substrate, and is integrated with the photo-sensing devices 50*a* and 50*b* and the transmission transistor (not shown). The photo-sensing devices 50*a* and 50*b* may be, for example, photodiodes. The photo-sensing devices 50*a* and 50*b* and the transmission transistor may be integrated in each pixel, and the photo-sensing devices 50*a* and 50*b* sense light and the sensed information may be transferred by the transmission transistor.

The photo-sensing devices 50*a* and 50*b* include a first photo-sensing device 50*a* sensing light in a first wavelength region, which is a long wavelength region, and a second photo-sensing device 50*b* sensing light in a second wavelength region, which is a short wavelength region. The first wavelength region may be, for example, a red wavelength region, and the second wavelength region may be, for example, a blue wavelength region.

The first photo-sensing device 50*a* and the second photo-sensing device 50*b* are arranged to be parallel along one direction or may be alternatively arranged.

Metal wires (not shown) and pads (not shown) are formed on the semiconductor substrate 110. In order to decrease signal delay, the metal wires and pads may be made of a metal having low resistivity, for example, aluminum (Al), copper (Cu), silver (Ag), and alloys thereof, but are not limited thereto.

Nanostructural bodies 70 are formed at predetermined or given intervals on the semiconductor substrate 110. Each nanostructural body 70 includes at least two parts having different optical paths, wherein the optical path refers to a distance through which vertically incident light is passed in the nanostructural body 70.

The optical path may be changed depending upon a length of the nanostructural body 70 in the vertical direction and a refractive index of the nanostructural body 70, and may be determined by the length of the nanostructural body 70 in the vertical direction under the hypothesis that the nanostructural body 70 has a constant refractive index regardless of position.

In other words, the nanostructural body 70 may have an asymmetric structure, and for example, may have a first part 70*a* having a first length d1 along a direction perpendicular to the semiconductor substrate 110 and a second part 70*b* having a second length d2 that is shorter than the first length d1. The first part 70*a* having the first length d1 may be disposed at the side of the first photo-sensing device 50*a* sensing light in a long wavelength region, and the second part 70b having the second length d2 may be disposed at the side of the second photo-sensing device 50b sensing light in a short wavelength region.

The first part 70a and the second part 70b of the nanostructural body 70 may contact each other or may be separated from each other.

The nanostructural body 70 is disposed between the first photo-sensing device 50a and the second photo-sensing device 50b, and splits white light vertically entered into the whole surface into each wavelength region, so that the light in the first wavelength region may be transferred into the first photo-sensing device 50a and the light in the second wavelength region may be transferred into the second photo-sensing device 50b. Light in a third wavelength region between the first wavelength region and the second wavelength region is preliminarily selectively absorbed by a photoelectric device 30 described later, so as to not pass through the nanostructural body 70.

The nanostructural body 70 may include a material having a predetermined or given refractive index, for example, a material having a refractive index of about 1.6 to about 2.6. The nanostructural body may include an oxide, a nitride, a sulfide, or a combination thereof, and for example may include a silicon oxide, a silicon nitride, a silicon oxynitride, a metal oxide, or a metal sulfide.

Figure 3:
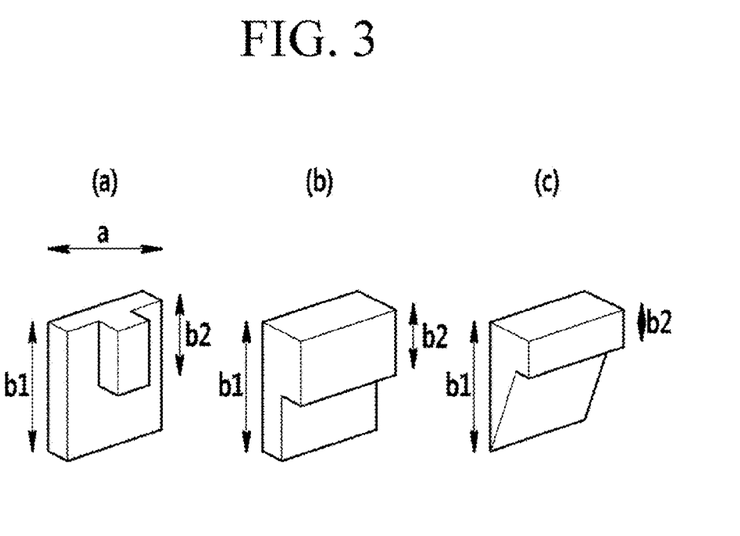
FIG. 3 is a schematic view showing various shapes of a nanostructural body applied with an image sensor according to example embodiments.

FIG. 3 is a schematic view showing various shapes of nanostructural body applied to the image sensor according to example embodiments.

The nanostructural body 70 may include a first part having a first length b1 in a length direction and a second part having a second length b2 that is shorter than the first length b1. The first part and the second part of the nanostructural body 70 may be, for example, stepped, sloped, or a combination thereof, but the shape is not particularly limited.

For example, b1<2 µm, b2<1 µm, and a>0.7 µm in FIG. 3, but they are not limited thereto.

The lower insulation layer 60 is formed on the semiconductor substrate 110. The insulation layer 60 may include, for example, a lower insulation layer 61 and an upper insulation layer 62, and the lower insulation layer 61 and the upper insulation layer 62 may be made of the same or different materials.

The insulation layer 60 may be made of an inorganic insulating material (e.g., a silicon oxide and/or a silicon nitride), a low dielectric constant (low K) material (e.g., SiC, SiCOH, SiCO, and SiOF), and/or an organic insulation material having improved planarization characteristics.

The insulation layer 60 surrounds the nanostructural body 70, and the nanostructural body 70 may include a material having a higher refractive index than that of the insulation layer 60. When the insulation layer 60 includes, for example, a silicon oxide (SiO$_x$), the nanostructural body 70 may include, for example, a silicon nitride (SiN$_x$ (0<x≤1.5)), a titanium oxide (TiO$_x$ (0<x≤2)), zinc sulfide (ZnS), or a combination thereof.

The photoelectric device 30 is formed on the insulation layer 60. The photoelectric device 30 includes a lower electrode 31 and an upper electrode 32 facing each other, and a light absorption layer 33 disposed between the lower electrode 31 and the upper electrode 32.

At least one of the lower electrode 31 and the upper electrode 32 is an anode, and the other is a cathode. The lower electrode 31 and the upper electrode 32 may be light-transmitting electrodes, and the light-transmitting electrodes may be made of, for example, a transparent conductor (e.g., indium tin oxide (ITO) or indium zinc oxide (IZO)) or may be a metal thin layer having a thin thickness of several nanometers to several tens of nanometers or a metal thin layer having a thin thickness of several nanometers to several tens of nanometers doped with a metal oxide.

The light absorption layer 33 may selectively absorb light in a third wavelength region between the first wavelength region and the second wavelength region. For example, when the first wavelength region is a red wavelength region and the second wavelength region is a blue wavelength region, the third wavelength region may be a green wavelength region. For example, the light absorption layer 33 may selectively absorb light in a green wavelength region, so only light in wavelength regions other than the green wavelength region passes through the photoelectric device 30.

The light absorption layer 33 may include a p-type semiconductor material selectively absorbing light in a green wavelength region and an n-type semiconductor material selectively absorbing light in a green wavelength region, and the p-type semiconductor material and the n-type semiconductor material may form a pn junction. The light absorption layer 33 may selectively absorb light in a green wavelength region to generate excitons, and then the generated excitons may be separated into holes and electrons to provide a photoelectric effect.

Each of the p-type semiconductor material and the n-type semiconductor material may have a bandgap of, for example, about 2.0 to about 2.5 eV, and the p-type semiconductor material and the n-type semiconductor material may have a LUMO difference of, for example, about 0.2 to about 0.7 eV.

The p-type semiconductor material may be, for example, quinacridone or a derivative thereof, and the n-type semiconductor material may be, for example, a cyanovinyl group-containing thiophene derivative, but they are not limited thereto.

The quinacridone or derivative thereof may be, for example, represented by the following Chemical Formula 1.

[Chemical Formula 1]

In the Chemical Formula 1, $R^1$ and $R^2$ are each independently hydrogen, a substituted or unsubstituted C1 to C30 alkyl group, a substituted or unsubstituted C6 to C30 aryl group, a substituted or unsubstituted C3 to C30 heteroaryl group, or a combination thereof, and $X^1$ and $X^2$ are each independently hydrogen or a substituted or unsubstituted C3 to C30 heterocyclic aromatic group.

The thiophene derivative may be, for example, selected from a compound represented by the following Chemical Formulae 2a to 2c.

[Chemical Formula 2a]

[Chemical Formula 2b]

[Chemical Formula 2c]

The light absorption layer 33 may be formed on the entire surface of the image sensor 100, so light may be absorbed on the entire surface of the image sensor 100, and thus the light area may be increased to provide high light-absorption efficiency.

The focusing lens 40 is provided on the photoelectric device 30. The focusing lens 40 may collect light into one region by controlling the incidence direction of the light. The one region may be a region where the nanostructural body 70 is positioned.

The focusing lens 40 may have a size covering at least one first photo-sensing device 50a and at least one second photo-sensing device 50b.

The light collected in the focusing lens 40 is focused into the nanostructural body 70 having an asymmetric structure positioned between the first photo-sensing device 50a and the second photo-sensing device 50b, and the focused light changes the progression direction according to wavelength while passing through the nanostructural body 70. The reason why the progression direction is changed according to the wavelength while passing through the nanostructural body 70 is that a refractive index difference causing destructive interference and/or constructive interference is changed according to the wavelength of light due to the asymmetry of the nanostructural body 70. Accordingly, for example, light of a first wavelength region, which is a long wavelength region, for example, a red wavelength region, may enter into the side of the first photo-sensing device 50a, and, for example, light of a second wavelength region, which is a short wavelength region, for example, a blue wavelength region, may enter into the side of the second photo-sensing device 50b.

The focusing lens 40 may have a shape of, for example, a cylinder or a hemisphere, but is not limited thereto.

FIG. 4 to FIG. 7 are schematic views showing various examples of image sensors according to example embodiments.

Figure 4:
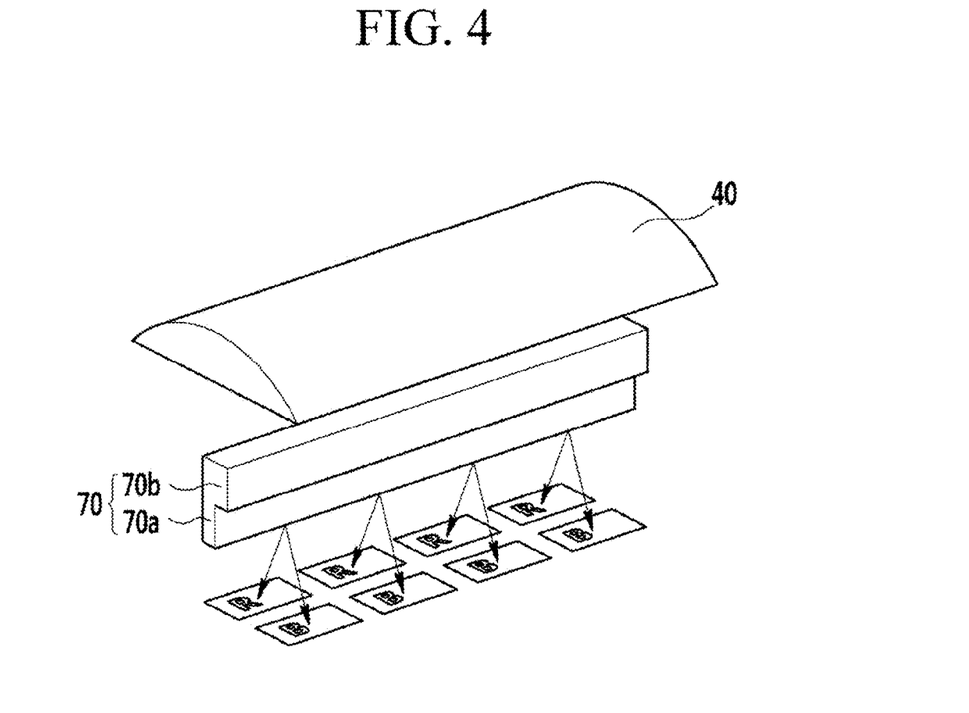
FIG. 4 to FIG. 7 are schematic views showing examples of image sensors according to example embodiments.

The image sensor shown in FIG. 4 has a structure in which a plurality of red photo-sensing devices (R) and a plurality of blue photo-sensing devices (B) are arranged along one direction, and the image sensor includes an elongated nanostructural body 70 disposed through a plurality of red photo-sensing devices (R) and a plurality of blue photo-sensing devices (B) along one direction and a cylindrical focusing lens 40.

Figure 5:
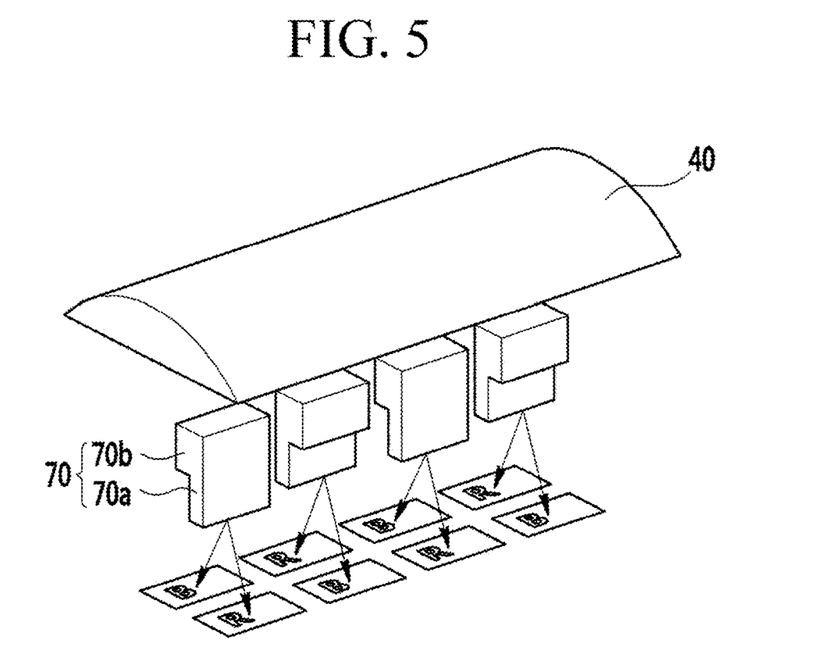

The image sensor shown in FIG. 5 has a structure in which a plurality of red photo-sensing devices (R) and a plurality of blue photo-sensing devices (B) are alternately arranged along one direction, and the image sensor includes nanostructural bodies 70 facing different directions according to the red photo-sensing device (R) and the blue photo-sensing device (B) and a cylindrical focusing lens 40.

Figure 6:
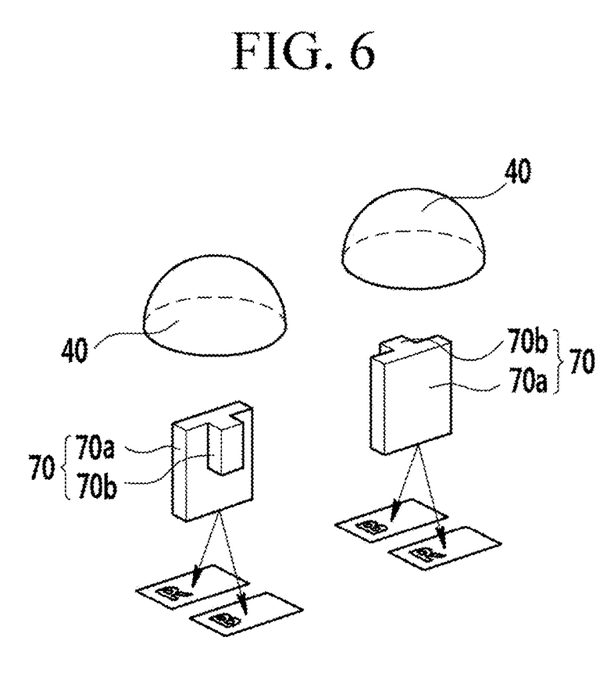

The image sensor shown in FIG. 6 includes a hemispheric focusing lens 40 in the image sensor shown in FIG. 4 or FIG. 5.

Figure 7:
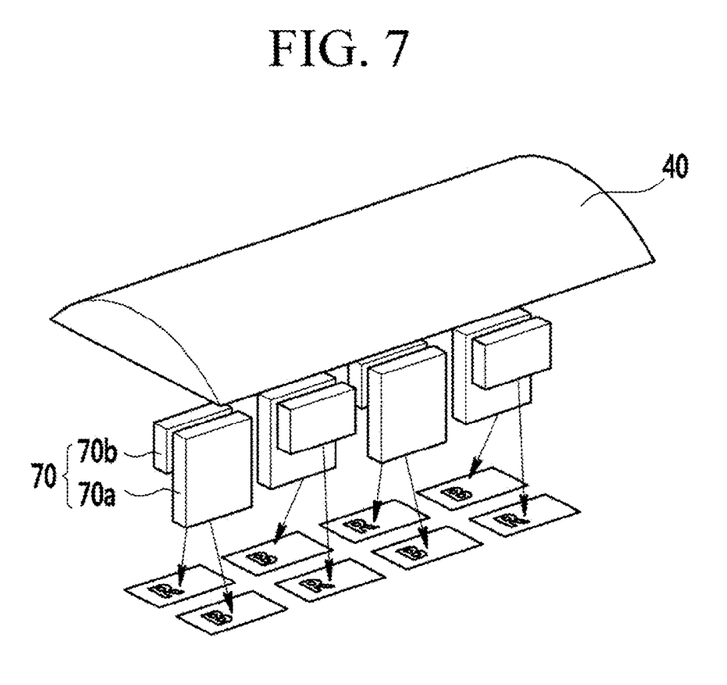

While the first part 70a and the second part 70b of the nanostructural body 70 shown in FIGS. 4 to 6 are contact each other, the first part 70a and the second part 70b of the nanostructural body 70 shown in FIG. 7 are separated from each other.

Figure 2:
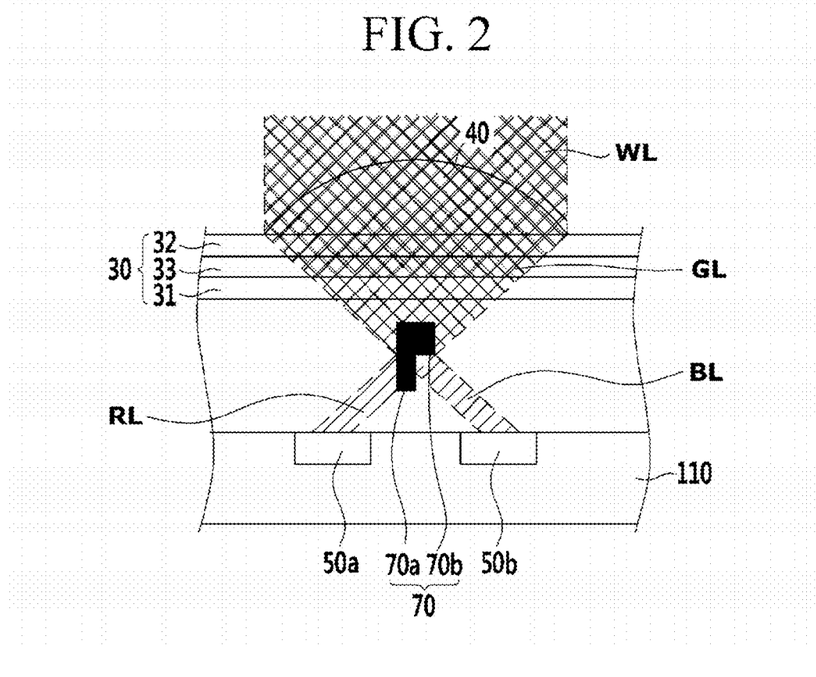
FIG. 2 is a schematic view showing a principle of the image sensor shown in FIG. 1.

FIG. 2 is a schematic view showing the principle of the image sensor shown in FIG. 1.

As shown in FIG. 2, when white light (WL) passes through the focusing lens 40, for example, light in the second wavelength region (GL) which is a green wavelength region is selectively absorbed by the photoelectric device 30 including a lower electrode 31, a light absorption layer 33, and a upper electrode 32, and light in wavelength regions other than the second wavelength region (GL) is focused into the nanostructural body 70 having an asymmetric structure to split the progression direction according to wavelength, for example, light in the first wavelength region (RL), e.g., a red wavelength region, progresses to the side of the first part 70a of the nanostructural body 70 to enter the first photo-sensing device 50a, and for example, light in the third wavelength region (BL), e.g., a blue wavelength region, progresses to the side of the second part 70b of the nanostructural body 70 to enter the second photo-sensing device 50b.

The photoelectric device 30 is formed on the entire surface of the image sensor to provide the wide light area, so that light in the second wavelength region may have high light-absorption efficiency.

In addition, light of the first wavelength region (RL) and light of the second wavelength region (BL) are separated by the nanostructural body 70, and respectively enter into the first photo-sensing device 50a and the second photo-sensing device 50b so an additional color filter is not required. Accordingly, light loss due to a color filter may be prevented or inhibited.

Further, light including light of the first wavelength region (RL) and light of the second wavelength region (BL) may enter into the first photo-sensing device 50a and the second photo-sensing device 50b, respectively, after passing through the nanostructural body 70, so the light area is increased by two times, compared to the case of using a color filter, to enhance the light-absorption efficiency to light of the first wavelength region (RL) and light of the second wavelength region (BL).

Resultantly, the absorption efficiency may be enhanced in all wavelength regions including the first wavelength region, the second wavelength region, and the third wavelength region so as to increase the sensitivity of an image sensor and to improve the performance of an electronic device including the image sensor.

The electronic device may include, for example, a mobile phone or a digital camera, but is not limited thereto.

Hereinafter, the present disclosure is illustrated in more detail with reference to examples. However, these are examples, and the present disclosure is not limited thereto.

Example 1

An image sensor is supposed under the following simulation conditions, and light transmittance and wavelength selectivity are anticipated.

Simulation Conditions

Nanostructural body: stepped nanostructural body having a first width (long width) of 0.32 μm, a second width (short width) of 0.16 μm, a first length (long length) of 1.2 μm, a second length (short length) of 0.6 μm, a thickness of 2 μm, and a distance (H) from an upper end of the nanostructural body to the light detector of 2.6 μm,

Focusing lens: Gaussian shape

Photoelectric device: ITO 100 nm/N,N-dimethylquinacridone (Chemical Formula 1a)+dicyanovinyl-terthiophene (Chemical Formula 2a) (1:1 wt/wt, 70 nm)/aluminum 80 nm

[Chemical Formula 1a]

[Chemical Formula 2a]

Comparative Example 1

An image sensor is prepared under the same conditions as in Example 1, except for changing the condition that a red filter and a blue filter are used instead of the nanostructure and not including the photoelectric device.

Comparative Example 2

An image sensor is prepared under the same conditions as in Example 1, except for changing the condition that the nanostructural body has a shape of a symmetrical rectangular parallelepiped (width of 0.28 μm, length of 1.20 μm, thickness of 2.00 μm) and not including the photoelectric device.

Evaluation 1

The image sensors obtained from Example 1 and Comparative Examples 1 and 2 are evaluated for light intensity arriving at the light detector when irradiating white light to the upper part of the focusing lens by the simulation.

Figure 8:
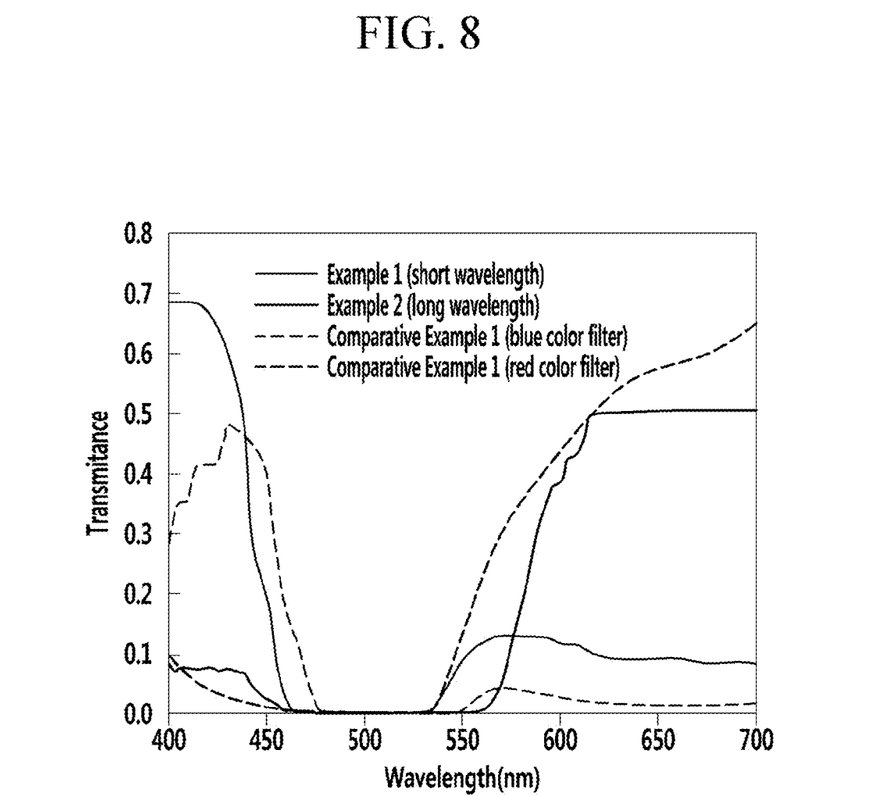
FIG. 8 is a graph showing light transmittance of image sensors according to Example 1 and Comparative Example 1 depending upon wavelength.
Figure 9:
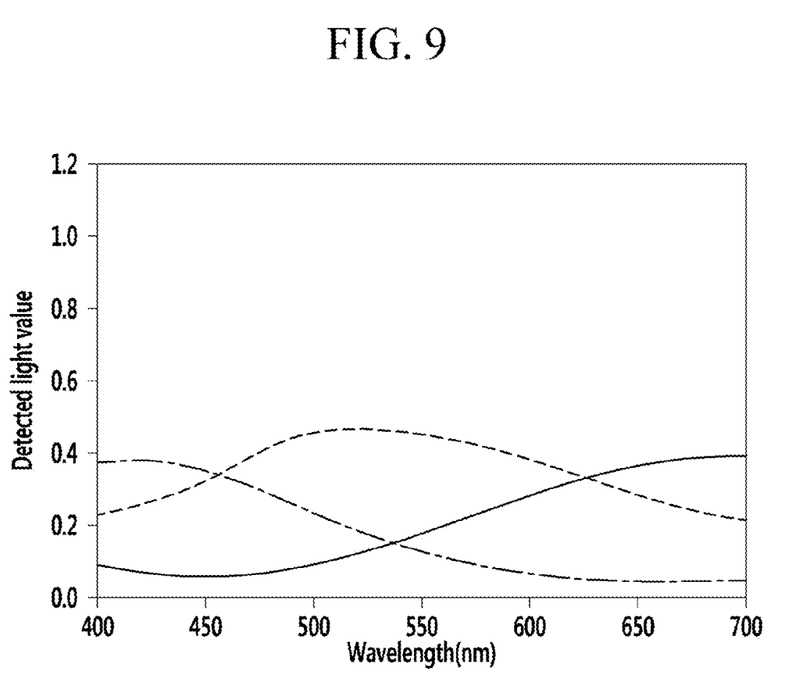
FIG. 9 is a graph showing light transmittance of an image sensor according to Comparative Example 2 depending upon wavelength.

FIG. 8 is a graph showing light transmittance of image sensors according to Example 1 and Comparative Example 1, and FIG. 9 is a graph showing light transmittance of the image sensor according to Comparative Example 2.

Referring to FIG. 8, it is understood that the image sensor according to Example 1 has higher light transmittance than that of the image sensor according to Comparative Example 1 at the short wavelength region of about 400 nm to about 470 nm and the long wavelength region of about 570 nm to about 700 nm. From the results, because the image sensor according to Example 1 may reduce the light loss due to the color filter, it is assumed that the light-absorption efficiency is higher than that of the image sensor according to Comparative Example 1.

In addition, light at about 470 nm to about 570 nm, which is the middle wavelength region, is preliminarily selectively absorbed by the photoelectric device, so it is understood that the image sensor according to Example 1 has higher wavelength selectivity in the region of about 400 nm to about 470 nm, which is the short wavelength region, and in the region of 570 nm to 700 nm, which is the long wavelength region.

On the other hand, referring to FIG. 9, the image sensor according to Comparative Example 2 has relatively low light transmittance in the long wavelength region and the short wavelength region, and also senses a substantial amount of light at about 470 nm to 570 nm, which is the middle wavelength region, so it is understood that the image sensor has low wavelength selectivity.

From the results, it is understood that the image sensor according to Example 1 may improve light-absorption efficiency and wavelength selectivity.

Evaluation 2

The image sensor according to Example 1 is evaluated for wavelength selectivity.

Figure 10:
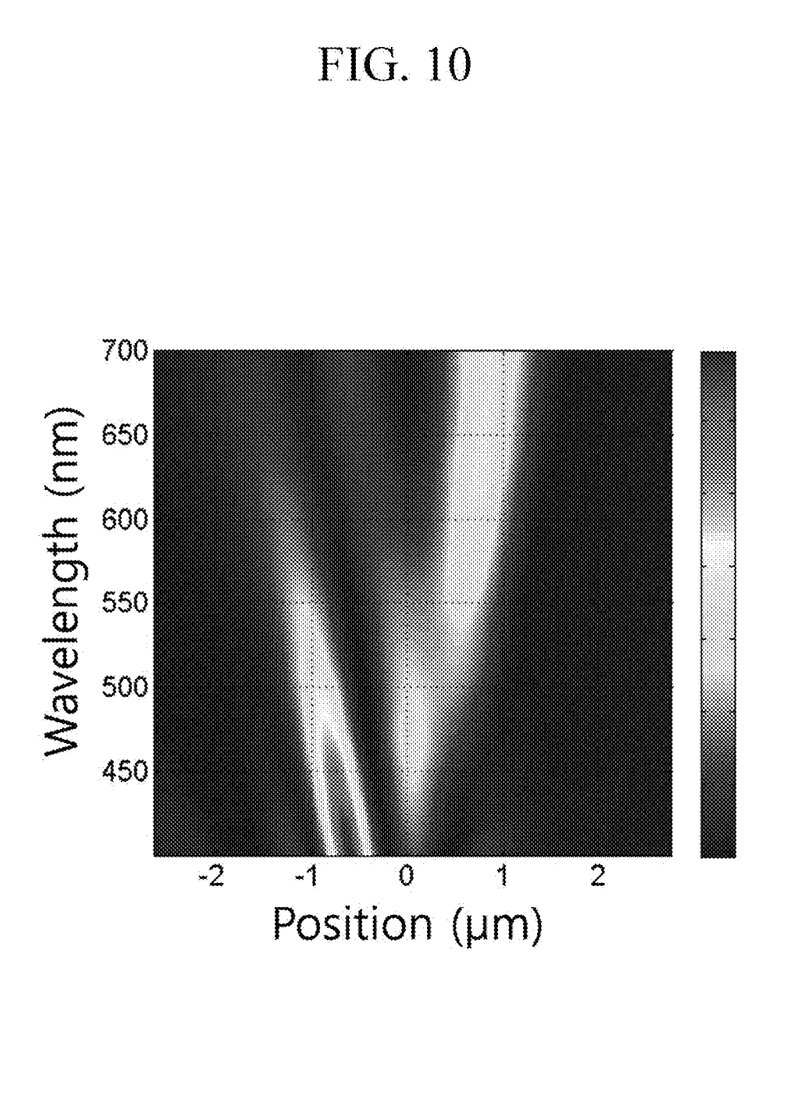
FIG. 10 is a spectroscopic spectrum showing wavelength selectivity of an image sensor according to Example 1.

FIG. 10 is a spectroscopic spectrum showing the wavelength selectivity of image sensor according to Example 1.

Referring to FIG. 10, it is confirmed that the wavelength selectivity of the image sensor according to Example 1 is high in the short wavelength region ranging from about 400 nm to about 470 nm and in a long wavelength region ranging from about 570 to about 700 nm, and it is assumed to be appropriately used in a pixel of about a 1 μm width because both the short wavelength region and the long wavelength region are sensed within a narrow width within about 1.5 μm.

While this disclosure has been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:

1. An image sensor, comprising:
   a semiconductor substrate integrated with photo-sensing devices, the photo-sensing devices including at least one first photo-sensing device sensing light in a first wavelength region and at least one second photo-sensing device sensing light in a second wavelength region shorter than the first wavelength region;
   a photoelectric device including a pair of electrodes facing each other and a light absorption layer between the electrodes, the photoelectric device selectively absorbing light in a third wavelength region between the first wavelength region and the second wavelength region such that only light in wavelength regions other than the third wavelength region passes through the photoelectric device; and
   a nanostructural body between the semiconductor substrate and the photoelectric device and configured to receive the light in wavelength regions other than the third wavelength region, the nanostructural body including a first part and a second part arranged between the at least one first photo sensing device and the at least one second photo-sensing device in a first direction, the first part having a first length and a first width, and the second part having a second length and a second width, the second length being less than the first length and the second width being less than the first width, wherein the first width and the second width are along a second direction perpendicular to the first direction and parallel to an upper surface of the semiconductor substrate.

2. The image sensor of claim 1, wherein the first wavelength region is a red wavelength region, the second wavelength region is a blue wavelength region, and the third wavelength region is a green wavelength region.

3. The image sensor of claim 1, wherein the nanostructural body has an asymmetric structure.

4. The image sensor of claim 1, wherein
the first part is adjacent to the at least one first photo-sensing device, and
the second part is adjacent to the at least one second photo-sensing device.

5. The image sensor of claim 1, wherein the first part and the second part are in contact with each other or separate from each other.

6. The image sensor of claim 1, wherein
the nanostructural body has a width of less than or equal to about 1 vim, and
the first length of the nanostructural body is less than or equal to about 2 μm.

7. The image sensor of claim 1, wherein the nanostructural body includes one of an oxide, a nitride, a sulfide, and a combination thereof.

8. The image sensor of claim 1, wherein the nanostructural body includes a material having a refractive index of about 1.6 to about 2.6.

9. The image sensor of claim 1, further comprising:
an insulation layer surrounding the nanostructural body between the semiconductor substrate and the photoelectric device,
wherein the nanostructural body includes a material having a higher refractive index than the insulation layer.

10. The image sensor of claim 9, wherein
the insulation layer includes a silicon oxide, and the nanostructural body includes one of a silicon nitride, a titanium oxide, zinc sulfide, and a combination thereof.

11. The image sensor of claim 1, wherein
the pair of electrodes facing each other are light-transmitting electrodes, and
the light absorption layer includes a p-type semiconductor material selectively absorbing light in the third wavelength region and an n-type semiconductor material selectively absorbing light in the third wavelength region.

12. The image sensor of claim 11, wherein the third wavelength region is a green wavelength region.

13. The image sensor of claim 1, wherein
the at least one first photo-sensing device and the at least one second photo-sensing device are alternately arranged along the first direction.

14. The image sensor of claim 1, further comprising:
a focusing lens configured to collect light into the nanostructural body by controlling the incidence direction of the light.

15. The image sensor of claim 14, wherein the focusing lens is on the photoelectric device.

16. The image sensor of claim 14, wherein the focusing lens covers at least one of the at least one first photo-sensing device and the at least one second photo-sensing device.

17. An electronic device comprising the image sensor according to claim 1.

18. The image sensor of claim 1, wherein the image sensor excludes a color filter for the light in the first and second wavelength regions.

19. The image sensor of claim 1, wherein the photo-sensing devices include a first group of photo-sensing devices including the at least one first photo-sensing device and a second group of photo-sensing devices including the at least one second photo-sensing device, and the photo-sensing devices consist of the first and second groups.

* * * * *